United States Patent
Kim et al.

(10) Patent No.: US 9,884,969 B2
(45) Date of Patent: *Feb. 6, 2018

(54) POLY-ROTAXANE COMPOUND, PHOTOCURABLE COATING COMPOSITION, AND COATING FILM

(71) Applicant: LG CHEM, LTD., Seoul (KR)

(72) Inventors: Heon Kim, Daejeon (KR); Yeong-Rae Chang, Daejeon (KR); Hye-Min Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/020,419

(22) Filed: Sep. 6, 2013

(65) Prior Publication Data
US 2014/0080936 A1 Mar. 20, 2014

Related U.S. Application Data (63) Continuation of application No. PCT/KR2013/004604, filed on May 27, 2013.

(30) Foreign Application Priority Data

May 25, 2012 (KR) .................. 10-2012-0056283
May 25, 2012 (KR) .................. 10-2012-0056285
(Continued)

(51) Int. Cl.
*C09D 7/12* (2006.01)
*C08B 37/16* (2006.01)
(Continued)

(52) U.S. Cl.
CPC ........ *C09D 7/1233* (2013.01); *C08B 37/0012* (2013.01); *C08B 37/0015* (2013.01);
(Continued)

(58) Field of Classification Search
CPC ....... C08L 3/02; C08F 2/46; H01L 2224/8492
(Continued)

(56) References Cited

U.S. PATENT DOCUMENTS 7,799,867 B2 9/2010 Ito et al.
7,943,718 B2 5/2011 Ito et al.
(Continued)

FOREIGN PATENT DOCUMENTS

CN 1910218 A 2/2007
CN 101278019 A 10/2008
(Continued)

OTHER PUBLICATIONS

International Search Report issued in International Application No. PCT/KR2013/004604 dated Aug. 8, 2013, 3 pages.
(Continued)

*Primary Examiner* — Michael Pepitone
*Assistant Examiner* — Jessica Roswell
(74) *Attorney, Agent, or Firm* — Rothwell, Figg, Ernst & Manbeck, P.C.

(57) ABSTRACT

The present invention relates to a novel polyrotaxane compound having a specific chemical structure, a photocurable coating composition that may provide a coating material having excellent mechanical properties such as scratch resistance, chemical resistance, abrasion resistance, and the like, and excellent self-healing capability, and a coating film obtained from the photocurable coating composition.

19 Claims, 3 Drawing Sheets

(30) Foreign Application Priority Data

| | | | |
|---|---|---|---|
| May 25, 2012 | (KR) | ................... | 10-2012-0056286 |
| May 25, 2012 | (KR) | ................... | 10-2012-0056287 |
| May 27, 2013 | (KR) | ................... | 10-2013-0059516 |

(51) Int. Cl.

| | |
|---|---|
| *C08L 101/00* | (2006.01) |
| *C08G 83/00* | (2006.01) |
| *C08G 63/08* | (2006.01) |
| *C09D 105/16* | (2006.01) |
| *C08L 5/16* | (2006.01) |
| *C09D 4/06* | (2006.01) |
| *C08J 7/04* | (2006.01) |
| *G03F 7/027* | (2006.01) |
| *G03F 7/031* | (2006.01) |
| *G03F 7/032* | (2006.01) |
| *G03F 7/033* | (2006.01) |
| *G03F 7/035* | (2006.01) |
| *G03F 7/075* | (2006.01) |
| *C08F 220/34* | (2006.01) |

(52) U.S. Cl.
CPC ........... *C08G 63/08* (2013.01); *C08G 83/007* (2013.01); *C08J 7/047* (2013.01); *C08L 5/16* (2013.01); *C08L 101/005* (2013.01); *C09D 4/06* (2013.01); *C09D 105/16* (2013.01); *G03F 7/027* (2013.01); *G03F 7/031* (2013.01); *G03F 7/032* (2013.01); *G03F 7/033* (2013.01); *G03F 7/035* (2013.01); *G03F 7/0757* (2013.01); *C08F 2220/343* (2013.01); *C08J 2367/02* (2013.01); *C08J 2400/21* (2013.01)

(58) Field of Classification Search
USPC ......................................... 522/8, 88; 524/48
See application file for complete search history.

(56) References Cited

U.S. PATENT DOCUMENTS

| | | | |
|---|---|---|---|
| 8,927,098 B2 * | 1/2015 | Jung ................... | C08B 37/0012 428/220 |
| 8,957,139 B2 | 2/2015 | Suzuki et al. | |
| 9,349,778 B2 * | 5/2016 | Kim ................... | H01L 51/5253 |
| 2009/0214871 A1 | 8/2009 | Fukuda et al. | |
| 2009/0312490 A1 | 12/2009 | Ito et al. | |
| 2010/0184934 A1 | 7/2010 | Ito et al. | |
| 2011/0105688 A1 | 5/2011 | Ruslim et al. | |
| 2011/0118376 A1 | 5/2011 | Hayashi et al. | |

FOREIGN PATENT DOCUMENTS

| | | |
|---|---|---|
| CN | 101278022 A | 10/2008 |
| CN | 101287775 A | 10/2008 |
| CN | 101784568 A | 7/2010 |
| CN | 102046662 A | 5/2011 |
| CN | 102317384 A | 1/2012 |
| EP | 2787010 A1 | 10/2014 |
| EP | 2 840 110 A1 | 2/2015 |
| EP | 2837651 A1 | 2/2015 |
| EP | 2840107 A1 | 2/2015 |
| EP | 2 843 007 A1 | 3/2015 |
| EP | 2842989 A1 | 3/2015 |
| EP | 2843008 A1 | 3/2015 |
| EP | 2857440 A1 | 4/2015 |
| EP | 2865707 A1 | 4/2015 |
| EP | 2873688 A1 | 5/2015 |
| EP | 2873689 A1 | 5/2015 |
| EP | 2873691 A1 | 5/2015 |
| EP | 2873692 A1 | 5/2015 |
| EP | 2873693 A1 | 5/2015 |
| EP | 2873699 A1 | 5/2015 |
| EP | 2873995 A1 | 5/2015 |
| EP | 2 949 692 A1 | 12/2015 |
| EP | 2949709 A1 | 12/2015 |
| JP | 2008-310286 A | 12/2008 |
| JP | 2009-204725 A | 9/2009 |
| JP | 2009-204727 A | 9/2009 |
| JP | 2011-046917 A | 3/2011 |
| JP | 2011-178931 A | 9/2011 |
| KR | 10-2007-0000473 A | 1/2007 |
| KR | 10-2011-0119704 A | 11/2011 |
| WO | 02/02159 A1 | 1/2002 |
| WO | 2006/088200 A1 | 8/2006 |
| WO | 2007-026578 A1 | 3/2007 |
| WO | 2009/136618 A1 | 11/2009 |
| WO | 2009/145073 A1 | 12/2009 |
| WO | 2010-092948 A1 | 8/2010 |
| WO | 2011/105532 A1 | 9/2011 |

OTHER PUBLICATIONS

Search Report issued in International Appln. No. PCT/KR2013/004605 dated Sep. 26, 2013, 2 pages.
Supplementary European Search Report issued in European Patent Application No. 13794275.1 dated Jul. 20, 2015, 8 pages.
Third Party Observation in corresponding European Patent Application No. 13794275.1 dated Sep. 11, 2015, 10 pages.
SeRM Super Polymer, User's Guide, Sep. 7, 2011 Version, Advanced Softmaterials Inc., 9 pages.
Extended European Search Report dated Feb. 4, 2016, issued in European Patent Application No. 13794675.2, 10 pages.
Latest UV Curing Practical Manual, Technology Information Association, 2005, 20 pages.
Karenz AOI®, printed from www.Karenz.jp/ja/aoi/ on Feb. 24, 2016, 9 pages.
Designation D 522-93a; "Standard Test Methods for Mandrel Bend Test of Attached Organic Coatings;" American Society for Testing and Materials, 4 pages.
Ciba IRGACURE 500; "Photoinitiator;" Edition: 4.9. 2001, Basel.; Ciba Specialty Chemicals Inc.; 3 pages.

* cited by examiner

POLY-ROTAXANE COMPOUND, PHOTOCURABLE COATING COMPOSITION, AND COATING FILM

CROSS REFERENCE TO RELATED APPLICATIONS

The present application is a continuation of International Application No. PCT/KR2013/004604 filed on May 27, 2013, which claims priority to and the benefit of Korean Patent Application No. 10-2012-0056283 filed on May 25, 2012, Korean Patent Application No. 10-2012-0056285 filed on May 25, 2012, Korean Patent Application No. 10-2012-0056286 filed on May 25, 2012, Korean Patent Application No. 10-2012-0056287 filed on May 25, 2012 and of Korean Patent Application No. 10-2013-0059516 filed on May 27, 2013, the disclosures of which are incorporated herein by reference in their entireties.

TECHNICAL FIELD

The present invention relates to a polyrotaxane compound, a photocurable coating composition, and a coating film, and more particularly to a novel polyrotaxane compound having a specific chemical structure, a photocurable coating composition that may provide a coating material having excellent mechanical properties such as scratch resistance, chemical resistance, abrasion resistance, and the like, and excellent self-healing capability, and a coating film obtained from the photocurable coating composition.

BACKGROUND OF THE ART

To protect against product damage by mechanical, physical, and chemical influences from the outside, various coating layers or coating films are applied on the surface of electrical and electronic devices such as mobile phones, electronic components, home appliances, automobile interior/exterior parts, plastic molded products, and the like. However, since scratches on the surface of product coating or cracks due to external impact lower appearance properties, performance, and cycle life, various studies are progressing to protect a product surface to maintain product quality for a long period of time.

Particularly, studies on coating materials having self-healing capability are actively progressing because they do not require an additional coating or repair process even when the surface is damaged, and are extremely favorable for appearance and performance maintenance of products. As a result of these studies, UV curable compositions using self-healing oligomers and inorganic particle or fluorinated compound-added compositions for improving scratch resistance and anti-pollution have been suggested, but coating materials obtained from the compositions may not have sufficient surface hardness and self-healing capability.

Further, previously known coating materials using urethane resin are two-component types of solutions thus requiring a process of combining two kinds of materials, they have low storage stability in a combined state, and the curing time is several tens of minutes.

A coating composition including a polymer or an active polymer material, or including particles or capsules treated therewith on the surface have been suggested. Although a coating layer using the composition exhibits self-healing capability to external impact, it does not have sufficient mechanical properties such as scratch resistance or durability, and compatibility between each component is low.

Recently, it has been suggested that if a coating material including a polyrotaxane compound is used, a coating film or a coating membrane having self-healing capability may be provided, and various methods are being attempted to apply the polyrotaxane compound in coating of automobiles or electronic products, and the like to commercialize it.

For example, WO2005-080469 describes substituting hydroxyl groups of a cyclic molecule α-cyclodextrin with hydroxypropyl groups or at a high substitution rate of methyl groups to improve properties of polyrotaxane.

WO2002-002159 describes crosslinking cyclic molecules α-cyclodextrin) of polyrotaxane using polyethylene glycol.

WO2007-026578 describes a method for preparing polyrotaxane that can be dissolved in toluene or ethyl acetate by substituting hydroxyl groups of α-cyclodextrin with hydrophobic groups of ε-caprolactone, and WO2010-092948 and WO2007-040262 describe paint including polyrotaxane wherein hydroxyl groups of α-cyclodextrin are substituted by hydrophobic groups of ε-caprolactone.

WO2009-136618 describes polyrotaxane wherein a part or all of the hydroxyl groups of the cyclic molecule α-cyclodextrin are substituted by residues of an organic halogen compound to form a radical polymerization initiation part.

However, to prepare previously known polyrotaxane compounds, a synthesis process consisting of many steps should be conducted, or synthesis conditions of high temperature/high pressure while using very limited solvents are required.

Further, coating materials using previously known polyrotaxane compounds do not have sufficient mechanical properties required for a coating material, such as scratch resistance, chemical resistance, and abrasion resistance, or do not have sufficient self-healing capability to scratches or external damage, and thus have limitations in commercialization.

PATENT REFERENCE (Patent Reference 0001) WO2005-080469
(Patent Reference 0002) WO2002-002159
(Patent Reference 0003) WO2007-026578
(Patent Reference 0004) WO2010-092948
(Patent Reference 0005) WO2007-040262
(Patent Reference 0006) WO2009-136618

DETAILED DESCRIPTION OF THE INVENTION

Technical Objectives

The present invention provides a novel polyrotaxane compound having a specific chemical structure.

The present invention also provides a photocurable coating composition that may provide a coating material having excellent mechanical properties such as scratch resistance, chemical resistance, abrasion resistance, and the like, as well as excellent self-healing capability.

The present invention also provides a coating film obtained from the photocurable coating composition.

Technical Solutions

The present invention provides a polyrotaxane compound including a macrocycle to which a lactone-based compound is bonded, wherein a (meth)acrylate-based compound is introduced at the end of the lactone-based compound at a ratio of 40 mol % to 70 mol %; a linear molecule penetrating the macrocycle; and blocking groups arranged at both ends of the linear molecule and preventing the macrocycle from escaping.

The present invention also provides a photocurable coating composition including: a polyrotaxane compound including a macrocycle to which a lactone-based compound is bonded, wherein a (meth)acrylate-based compound is introduced at the end of the lactone-based compound at a ratio of 40 mol % to 70 mol %; a linear molecule penetrating the macrocycle; and blocking groups arranged at both ends of the linear molecule and preventing the macrocycle from escaping, a polymer resin or a precursor thereof, and a photoinitiator.

The present invention also provides a coating film including a photocured product of the photocurable coating composition.

Hereinafter, a polyrotaxane compound, a photocurable coating composition, and a coating film according to specific embodiments of the invention will be explained in detail.

According to one embodiment of the invention, a polyrotaxane compound is provided that includes a macrocycle to which a lactone-based compound is bonded, wherein a (meth)acrylate-based compound is introduced at the end of the lactone-based compound at a ratio of 40 mol % to 70 mol %; a linear molecule penetrating the macrocycle; and blocking groups arranged at both ends of the linear molecule and preventing the macrocycle from escaping.

As the result of studies on compounds that can be used as a coating material having a self-healing capability, the inventors newly synthesized a polyrotaxane compound having the above specific structure, and confirmed through experiments that if the polyrotaxane compound is used as a coating material, a self-healing capability may be exhibited when a scratch or external damage is generated in the coating material, while achieving excellent mechanical properties such as scratch resistance, chemical resistance, and the like, and completed the invention.

The polyrotaxane refers to a structurally interlocked compound consisting of a dumbbell shaped molecule and a macrocycle, wherein the dumbbell shaped molecule includes a certain linear molecule and blocking groups arranged at both ends of the linear molecule, the linear molecule penetrates the inside of the macrocycle, and the macrocycle may move along the linear molecule and be prevented from escaping by the blocking groups.

In the polyrotaxane compound according to one embodiment, a lactone-based compound is bonded to the macrocycle, and a (meth)acrylate-based compound is bonded at the end of the lactone-based compound that is bonded to the macrocycle at a ratio of 40 mol % to 70 mol %.

That is, in the polyrotaxane compound, the ratio of the (meth)acrylate-based compound introduced at the end of the lactone-based compound may be 40 mol % to 70 mol %, and preferably 45 mol % to 65 mol %.

If the ratio of the (meth)acrylate-based compound introduced at the end of the lactone-based compound is less than 40 mol %, sufficient crosslinking reaction with a polymer resin or a precursor thereof may not occur when applied as a photocurable coating composition, and thus, a coating material formed from the photocurable coating composition may not achieve sufficient mechanical properties such as scratch resistance, chemical resistance, abrasion resistance, and the like, hydroxyl functional groups remaining at the end of the lactone-based compound may be increased to increase polarity of the polyrotaxane compound, and compatibility with a non-polar solvent that can be used in the photocurable coating composition may be decreased to lower the quality of appearance of the final product.

Further, if the ratio of the (meth)acrylate-based compound introduced at the end of the lactone-based compound is greater than 70 mol %, excessive crosslinking reaction with a polymer resin or a precursor thereof may occur when applied as a photocurable coating composition, and thus, a coating material formed from the photocurable coating composition may not achieve sufficient elasticity or self-healing capability, and the degree of crosslinking of the coating material may be significantly increased to lower elasticity [brittleness may be significantly increased] and lower the stability of the photocurable coating composition.

The introduction rate or substitution rate of the (meth)acrylate-based compound may be measured from the ratio of the residue of the lactone-based compound bonded to the macrocycle of the polyrotaxane compound and the residue of the (meth)acrylate-based compound. For example, the introduction rate or substitution rate may be calculated by comparing mole number or NMR peak intensity of a specific functional group included in the lactone-based compound, for example, "—$CH_2$—", at a specific location, and mole number or NMR peak intensity of a specific functional group included in the (meth)acrylate-based compound, for example, "—$CH_2$—", at a specific location.

As used herein, the term "residue" refers to a certain part or unit that is included in a product of a chemical reaction when a specific compound participates in the chemical reaction, and is derived from the specific compound.

As used herein, the term "(meth)acrylate-based compound" is used to commonly designate an acrylate-based compound and a (meth)acrylate-based compound.

The macrocycle may include any macrocycles without specific limitations as long as it has a sufficient size to penetrate or surround the linear molecule, and it may include a functional group such as a hydroxyl, an amino, a carboxyl, a thiol, or an aldehyde group that may react with other polymers or compounds. Specific examples of the macrocycle may include α-cyclodextrin, β-cyclodextrin, γ-cyclodextrin, and a mixture thereof.

The lactone-base compound bonded to the macrocycle may be directly bonded to the macrocycle, or may be bonded by a C1-10 linear or branched oxyalkylene group. The functional group that mediates the bond may be determined according to the kind of the functional group substituted in the macrocycle or the lactone-based compound, or the kind of the compound used in the reaction of the macrocycle and the lactone-based compound.

The lactone-based compound may include a C3-12 lactone-based compound or a polylactone-based compound including C3-12 lactone-based repeating units. Thereby, if the lactone-based compound is bonded to the macrocycle and the (meth)acrylate-based compound, in the polyrotaxane compound, the residue of the lactone-based compound may include a functional group of the following Chemical Formula 1.

[Chemical Formula 1]

In Chemical Formula 1, m is an integer of from 2 to 11, preferably an integer of from 3 to 7, and n is an integer of from 1 to 20, preferably an integer of from 1 to 10.

At the end of the lactone-based compound that is bonded to the macrocycle, a (meth)acrylate-based compound may be introduced. The "introduction" means a substituted or bonded state.

Specifically, the (meth)acrylate-based compound may be directly bonded to the end of the lactone-based compound, or may be bonded through a urethane bond (—NH—CO—O—), an ether bond (—O—), a thioester bond (—S—CO—O—), or an ester bond (—CO—O—). The kind of the functional group that mediates a bond between the (meth)acrylate-based compound and the lactone-based compound may be determined according to the kind of the functional groups respectively substituted in the (meth)acrylate-based compound and the lactone-based compound, or the kind of the compound used in the reaction of the (meth)acrylate-based compound and the lactone-based compound.

For example, if a (meth)acrylate-based compound including at least one of an isocyanate group, a carboxyl group, a hydroxyl group, a thioate group, or a halogen group is reacted with a macrocycle to which a lactone-based compound is bonded, a direct bond, a urethane bond (—NH—CO—O—), an ether bond (—O—), a thioester bond (—S—CO—O—), or an ester bond (—CO—O—) may be formed. Further, if a reaction product of the lactone-based compound-bonded macrocycle with a compound including at least two of an isocyanate group, a carboxyl group, a hydroxyl group, a thioate group, or a halogen group is reacted with a (meth)acrylate-based compound including at least one of a hydroxyl group or a carboxyl group, at least one of a urethane bond (—NH—CO—O—), an ether bond (—O—), a thioester bond (—S—CO—O—), or an ester bond (—CO—O—) may be formed.

The (meth)acrylate-based compound may be a (meth)acryloyl alkyl compound, a (meth)acryloyl cycloalkyl compound, or a (meth)acryloyl aryl compound, to which at least one of an isocyanate group, a carboxyl group, a thioate group, a hydroxyl group, or a halogen group is bonded at the end.

Herein, a C1-12 linear or branched alkylene group may be included in the (meth)acryloyl alkyl compound, a C4-20 cycloalkylene group may be included in the (meth)acryloyl cycloalkyl compound, and a C6-20 arylene group may be included in the (meth)acryloyl aryl compound.

Thereby, if the (meth)acrylate-based compound is bonded to the end of the lactone-based compound, in the polyrotaxane compound, the residue of the (meth)acrylate-base compound may include a functional group of the following Chemical Formula 2.

[Formula 2]

In Chemical Formula 2, $R_1$ is hydrogen or a methyl, and $R_2$ is a C1-12 linear or branched alkylene group, a C4-20 cycloalkylene group, or a C6-20 arylene group. The * denotes a bonding point.

The polyrotaxane compound includes a double bond that can be used in a crosslinking or polymerization reaction at the end of the macrocycle, and thus, if the polyrotaxane compound is used as a coating material, it may be more easily bonded with a binder resin while securing much higher mechanical properties such as scratch resistance, chemical resistance, abrasion resistance, and the like, thus securing elasticity or elasticity recovery capability to improve the self-healing capability.

Meanwhile, the liner molecule may include any compound that has a molecular weight over certain level and has a linear shape, but a polyalkylene-based compound or a polylactone-based compound is preferably used. Specifically, a polyoxyalkylene-based compound having a C1-8 oxyalkylene repeating unit or a polylactone-based compound having a C3-10 lactone-based repeating unit may be used.

Further, the linear molecule may have a weight average molecular weight of 1000 to 50,000. If the weight average molecular weight of the linear molecule is too low, a coating material prepared using the same may not have sufficient mechanical properties or self-healing capability, and if the weight average molecular weight is too high, compatibility of the prepared coating material may be lowered or the appearance or uniformity of the material may be significantly lowered.

Meanwhile, the blocking group may be appropriately controlled according to the property of the prepared polyrotaxane compound, and for example, at least one or two selected from the group consisting of dinitrophenyl, cyclodextrin, adamantane, trityl, fluorescein, and pyrene groups may be used.

The polyrotaxane compound having the above structure may have a weight average molecular weight of 100,000 to 800,000, preferably 200,000 to 700,000, and more preferably 350,000 to 650,000. If the weight average molecular weight of the polyrotaxane compound is too low, a coating material prepared therefrom may not have sufficient mechanical properties or self-healing capability, and if the weight average molecular weight is too high, compatibility of the prepared coating material may be lowered, or the appearance or uniformity of the material may be significantly lowered.

Further, since the (meth)acrylate-based compound may be introduced at the end of the macrocycle, the polyrotaxane compound may have a relatively low OH value. That is, if only a lactone-based compound is bonded to the macrocycle, multiple hydroxyl (—OH) groups may exist in the polyrotaxane molecule, but as the (meth)acrylate-based compound is introduced at the end of the lactone-based compound, the OH value of the polyrotaxane compound may be lowered.

Meanwhile, the polyrotaxane compound according to one embodiment may be prepared by a method including the steps of reacting a macrocycle included in polyrotaxane with a lactone-based compound, and reacting the reaction product of the macrocycle and the lactone-based compound with a (meth)acrylate-based compound.

The inventors reacted a macrocycle of polyrotaxane with a lactone-based compound, and then introduced a (meth)acrylate-based compound at the end of the lactone-based compound, thereby synthesizing a novel polyrotaxane compound.

Specifically, the step of reacting a reaction product of the macrocycle and the lactone-based compound with a (meth)acrylate-based compound may include reacting a reaction product of the macrocycle and the lactone-based compound with a (meth)acrylate-based compound including at least one of an isocyanate group, a carboxyl group, a thioate group, a hydroxyl group, or a halogen group.

The macrocycle and the lactone-based compound may be bonded through a direct reaction or a reaction adding a C1-10 linear or branched oxyalkylene group.

By reacting a (meth)acrylate-based compound including at least one of an isocyanate group, a carboxyl group, a thioate group, a hydroxyl group, or a halogen group with the reaction product of the macrocycle and the lactone-based compound, the above-explained polyrotaxane compound may be prepared.

Herein, the ratio of the (meth)acrylate-based compound introduced at the end of the lactone-based compound may be controlled to 40 mol % to 70 mol %, or 45 mol % to 65 mol %, by reacting them while comparing the amount of the (meth)acrylate-based compound with the amount of the lactone-based compound.

Specifically, in the process of reacting the lactone-based compound bonded to the macrocycle of polyrotaxane with the (meth)acrylate-based compound, the (meth)acrylate-based compound may be more easily and uniformly introduced at the end of the lactone-based compound through a single reaction step by using (meth)acrylate-introduced isocyanate, instead of multiple reactions using diisocyanate commonly used in a urethane synthesis reaction.

Meanwhile, the step of reacting a reaction product of a macrocycle and a lactone-based compound with a (meth)acrylate-based compound may include: a first step of reacting a reaction product of a macrocycle and a lactone-based compound with a C1-20 aliphatic compound, a C4-20 cycloaliphatic compound, or a C6-20 aromatic compound including at least two of an isocyanate group, a carboxyl group, a thioate group, a hydroxyl group, or a halogen group; and a second step of reacting the product of the first step with a (meth)acrylate-based compound including at least one of a hydroxy group and a carboxyl group.

That is, the above-explained polyrotaxane compound may be synthesized by reacting a reaction product of a macrocycle and a lactone-based compound with a compound including at least two specific functional groups, and then reacting the reaction product with a (meth)acrylate-based compound including at least one of a hydroxyl group and a carboxyl group.

The step of reacting the reaction product of a macrocycle and a lactone-based compound with a (meth)acrylate-based compound may be conducted at 40° C. to 120° C., preferably 50° C. to 100° C., for 1 to 20 hours, preferably 2 to 10 hours.

In the preparation method of polyrotaxane, an appropriate catalyst may be selected and used according to the kind of used compound or functional groups substituted in the compound, and for example, a catalyst such as an organic tin compound and the like may be used.

Meanwhile, according to another embodiment of the invention, a photocurable coating composition is provided, including: a polyrotaxane compound including a macrocycle to which a lactone-based compound is bonded, wherein a (meth)acrylate-based compound is introduced at the end of the lactone-based compound at a ratio of 40 mol % to 70 mol %; a linear molecule penetrating the macrocycle; and blocking groups arranged at both ends of the linear molecule and preventing the macrocycle from escaping, a polymer resin or a precursor thereof, and a photoinitiator.

As explained above, the inventors confirmed through experiments that if a polyrotaxane compound having the above specific structure is applied to a photocurable coating composition, a coating material that may exhibit high self-healing capability to a scratch or external damage while securing excellent mechanical properties such as scratch resistance, chemical resistance, abrasion resistance, and the like may be provided, and completed the invention.

Particularly, since a double bond that can be used in a crosslinking reaction or a polymerization reaction is included at the end of the macrocycle of the polyrotaxane compound, a coating material prepared using a photocurable coating composition including the polyrotaxane compound may be more easily bonded or crosslinked with a polymer resin to achieve high elasticity or elasticity recovery capability, while securing excellent mechanical properties such as scratch resistance, chemical resistance, abrasion resistance, and the like, and may exhibit excellent self-healing capability to scratches or external damage.

Further, as explained above, in the polyrotaxane compound, the ratio of the (meth)acrylate-based compound introduced at the end of the lactone-based compound may be 40 mol % to 70 mol %, and preferably 45 mol % to 65 mol %.

If the ratio of the (meth)acrylate-based compound introduced at the end of the lactone-based compound is less than 40 mol %, sufficient crosslinking reaction with a polymer resin or a precursor thereof may not occur when applied to a photocurable coating composition, and thus, a coating material formed from the photocurable coating composition may not achieve sufficient mechanical properties such as scratch resistance, chemical resistance, abrasion resistance, and the like, hydroxyl functional groups remaining at the end of the lactone-based compound may be increased to increase polarity of the polyrotaxane compound, and compatibility with a non-polar solvent that can be used in the photocurable coating composition may be lowered to lower the quality of appearance of the final product.

In addition, if the ratio of the (meth)acrylate-based compound introduced at the end of the lactone-based compound is greater than 70 mol %, excessive crosslinking reaction with a polymer resin or a precursor thereof may occur when applied to a photocurable coating composition, and thus, a coating material formed from the photocurable coating material may not achieve sufficient elasticity or self-healing capability, the degree of crosslinking of the coating material may be significantly increased to lower elasticity [brittleness may be significantly increased], and stability of the photocurable coating composition may also be lowered.

Specific examples of the polymer resin that can be used in the photocurable coating composition may include a polysiloxane-based resin, a (meth)acrylate-based resin, a urethane (meth)acrylate-based resin, a mixture thereof, or a copolymer thereof, and preferably, a urethane (meth)acrylate-based resin may be used.

The polymer resin may have weight average molecular weight of 20,000 to 800,000, preferably 50,000 to 700,000. If the weight average molecular weight of the polymer resin is too low, a coating material formed from the coating composition may not have sufficient mechanical properties or self-healing capability, and if the weight average molecular weight is too high, homogeneity of the shape or properties of the coating composition may be lowered, and the final properties of the prepared coating material may also be lowered.

Meanwhile, the photocurable coating composition may include a precursor of the polymer resin, for example, monomers or oligomers, for synthesis of the polymer resin. Specifically, the precursor of the polymer resin may include monomers or oligomers including at least one functional group selected from the group consisting of (meth)acrylate, vinyl, siloxane, epoxy, and urethane groups. The precursor of the polymer resin, in a photocuring process, i.e., if UV or visible rays are irradiated, may form a polymer resin, or cause a crosslinking reaction between precursors of the polymer resin or a crosslinking reaction with the polyrotaxane compound to form a polymer resin. Further, one kind of the above-explained monomers or oligomers may be used as the precursor of a polymer resin to form a polymer resin, or two or more kinds of the monomers or oligomers may be used to form a polymer resin.

Specific examples of the monomers including a (meth) acrylate group may include dipentaerythritol hexa(meth) acrylate, pentaerythritol tetra(meth)acrylate, pentaerythritol tri(meth)acrylate, trimethylene propyl tri(meth)acrylate, ethylene glycol di(meth)acrylate, hexanediol di(meth)acrylate, ethyl(meth)acrylate, ethylhexyl(meth)acrylate, butyl(meth) acrylate, hydroxyethyl(meth)acrylate, polycaprolactone modified (meth)acrylate, hydroxyalkyl(meth)acrylate, or a mixture thereof.

Specific examples of the oligomers including a (meth) acrylate group may include a urethane modified acrylate oligomer, an epoxy acrylate oligomer, an etheracrylate oligomer, and the like, including 2 to 10 (meth)acrylate groups. The oligomer may have a weight average molecular weight of 1000 to 10,000.

Specific examples of the monomers including a vinyl group may include divinyl benzene, styrene, paramethylstyrene, and the like.

Specific examples of the monomers including a urethane group may include urethane acrylate obtained by the reaction of a polyisocyanate and a (meth)acrylate such as polycaprolactone modified (meth)acrylate, hydroxyalkyl (meth)acrylate, and the like.

Meanwhile, the coating composition may include a photoinitiator, and as the photoinitiator, any compounds known to be commonly used in the art may be used without specific limitations, and for example, a benzophenone-based compound, an acetophenone-based compound, a biimidazole-based compound, a triazine-based compound, an oxime-based compound, or a mixture thereof may be used. Specific examples of the photoinitiator may include benzophenone, benzoyl methyl benzoate, acetophenone, 2,4-diethyl thioxanthone, 2-chloro thioxanthone, ethyl anthraquinone, 1-hydroxy-cyclohexyl-phenyl-ketone (a commercially available product, Irgacure 184 (Ciba Company)), 2-hydroxy-2-methyl-1-phenyl-propan-1-one, and the like.

The photocurable coating composition may include 5 to 90 wt %, preferably 20 to 75 wt % of the polyrotaxane compound; 5 to 90 wt %, preferably 20 to 75 wt % of the polymer resin or a precursor thereof; and 0.01 to 15 wt %, preferably 0.5 to 10 wt % of the photoinitiator.

If the content of the polyrotaxane compound in the photocurable coating composition is too high, properties of a coating material obtained from the photocurable coating composition (for example, a coating film and the like) such as solvent compatibility, coatability, brittleness, and the like may be lowered.

If the content of the polyrotaxane compound in the photocurable coating composition is too low, properties of a coating material obtained from the photocurable coating composition (for example, a coating film and the like) such as self-healing capability, scratch resistance, surface hardness, chemical resistance, anti-pollution, and the like, as well as elasticity of the coating film, may not be sufficient.

In the photocurable coating composition, the ratio of the polyrotaxane compound to the polymer resin or a precursor thereof may be 1:0.5 to 1:1.5.

The coating composition may further include an organic solvent. As the organic solvent, those known to be usable in a coating composition may be used without specific limitations. For example, a ketone-based organic solvent such as methyl isobutyl ketone, methyl ethyl ketone, dimethyl ketone, and the like; an alcohol organic solvent such as isopropyl alcohol, isobutyl alcohol, normal butyl alcohol, and the like; an acetate organic solvent such as ethyl acetate, normal butyl acetate, and the like; and a cellusolve organic solvent such as ethyl cellusolve, butyl cellusolve, and the like may be used, but the organic solvent is not limited thereto.

The amount of the organic solvent may be controlled considering properties of the coating composition, a coating method, or specific properties of the finally prepared product, and for example, it may be used in an amount of 5 to 200 parts by weight based on 100 parts by weight of the polymer resin or a precursor thereof.

Meanwhile, if a thermal initiator is used in the coating composition instead of the photoinitiator, a thermosetting coating composition may be provided. That is, a thermosetting coating composition including the above-explained polyrotaxane, a polymer resin or a precursor thereof, and a thermal initiator may be provided. Herein, as the polymer resin or a precursor thereof, a commonly used thermosetting resin may be applied, and for example, an epoxy resin and the like may be applied.

Meanwhile, according to yet another embodiment of the invention, a coating film including a photocured product of the above-explained photocurable coating composition is provided.

As explained, if a polyrotaxane compound having a specific structure is applied to a photocurable coating composition, a coating material that may exhibit high self-healing capability to a scratch or external damage while securing excellent mechanical properties such as scratch resistance, chemical resistance, abrasion resistance, and the like may be provided.

Specifically, by irradiating UV or visible rays, for example UV or visible rays of a 200~400 nm wavelength, to the photocurable coating composition, photocuring may occur, and the coating material may be provided. The amount of exposure of UV or visible rays is not specifically limited, and for example, 50 to 4000 mJ/cm$^2$ is preferable. The exposure time in the photocuring step is not specifically limited, and it may be appropriately varied according to an exposure device, a wavelength of irradiated rays, or the amount of exposure.

After the photocurable coating composition is coated on a practically applied part, for example, an automobile, the surface of electrical/electronic product or device, and the like, a coating film or a coating membrane may be formed through the photocure process.

Advantageous Effect of the Invention

According to the present invention, a novel polyrotaxane compound having a specific chemical structure, a photocurable coating composition that may provide a coating material having excellent mechanical properties such as scratch resistance, chemical resistance, abrasion resistance, and the like, and having excellent self-healing capability, and a coating film obtained from the photocurable coating composition are provided.

The photocurable coating composition or coating film may be applied in the field of surface coating of an electrical or electronic product or device, and the like, to provide a coating material or a coating film having excellent mechanical properties such as scratch resistance, chemical resistance, and abrasion resistance, and self-healing capability.

DETAILS FOR PRACTICING THE INVENTION

Hereinafter, the present invention will be explained in detail with reference to the following examples. However, these examples are only to illustrate the invention, and the scope of the invention is not limited thereto.

Examples 1 and 2 and Comparative Example 1: Synthesis of Polyrotaxane

Example 1

50 g of a caprolactone-grafted polyrotaxane polymer [A1000, Advanced Soft Material Inc.] was introduced into a reactor, and then 4.53 g of Karenz-AOI [2-acryloylethyl isocyanate, Showadenko K.K.], 20 mg of dibutyltin dilaurate [DBTDL, Merck & Co, Inc.], 110 mg of hydroquinone monomethylene ether, and 315 g of methylethylketone were added thereto and reacted at 70° C. for 5 hours, to obtain a polyrotaxane polymer liquid including cyclodextrin to which a polylactone-based compound having an acrylate-based compound introduced at the end is bonded as a macrocycle (solid content: 15%).

The polyrotaxane polymer liquid was dripped into an n-hexane solvent to precipitate a polymer, which was filtered to obtain a white solid polymer (weight average molecular weight: 500,000).

Figure 1:
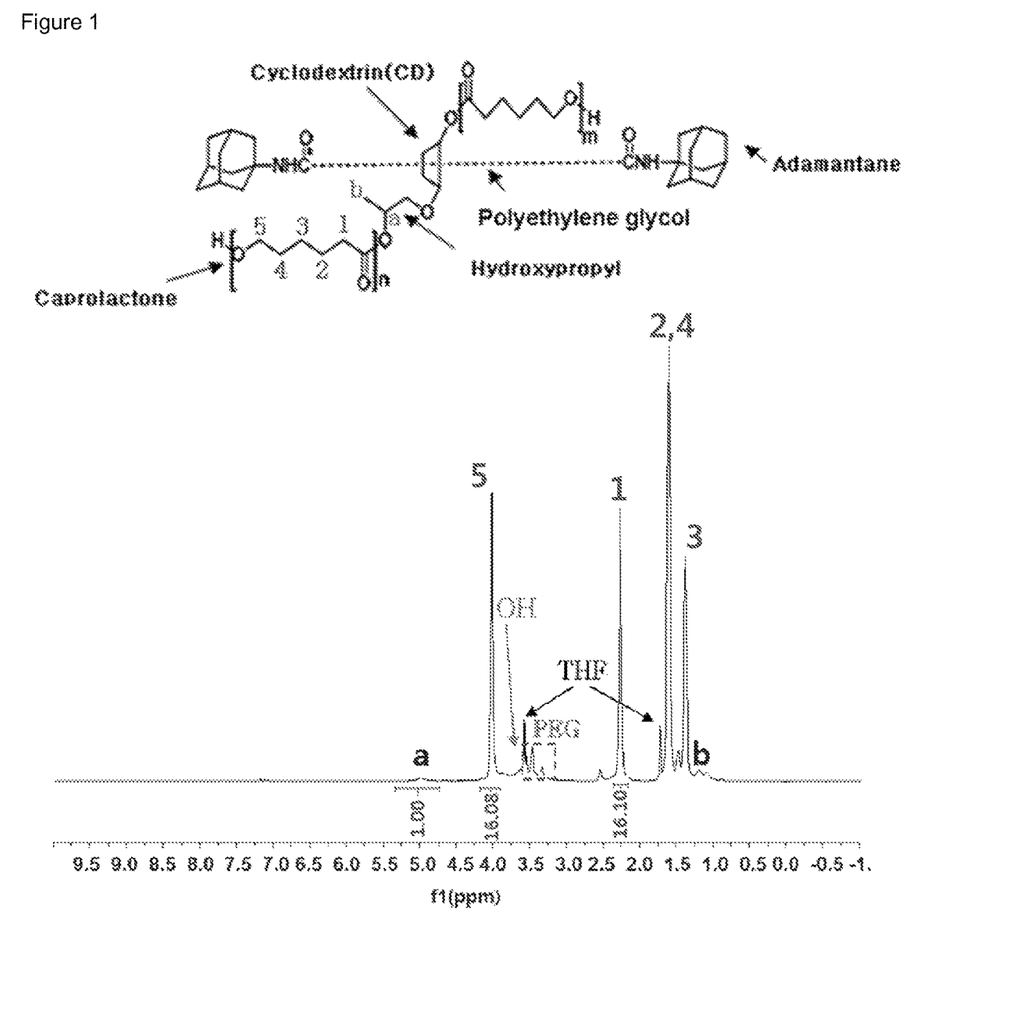
FIG. 1 shows 1H NMR data of a polyrotaxane polymer [A1000] that is used as a reactant in Example 1.
Figure 2:
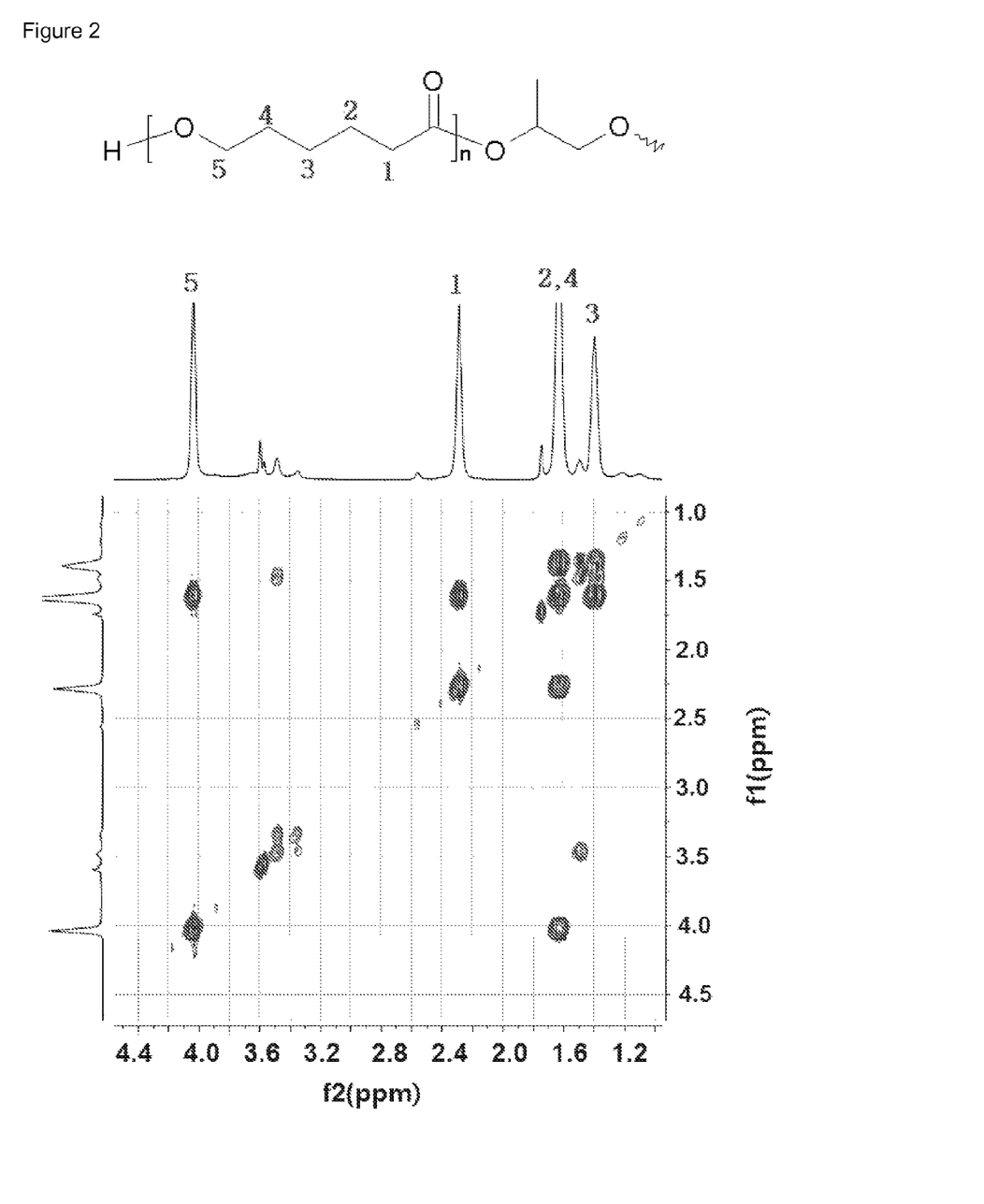
FIG. 2 shows a gCOSY NMR spectrum confirming the structure of caprolactone included in the polyrotaxane polymer [A1000] that is used as a reactant in Example 1.

1H NMR data of the polyrotaxane polymer [A1000] that was used as a reactant is shown in FIG. 1, and the structure of the caprolactone bonded to the macrocycle of polyrotaxane was confirmed through the gCOSY NMR spectrum of FIG. 2.

Figure 3:
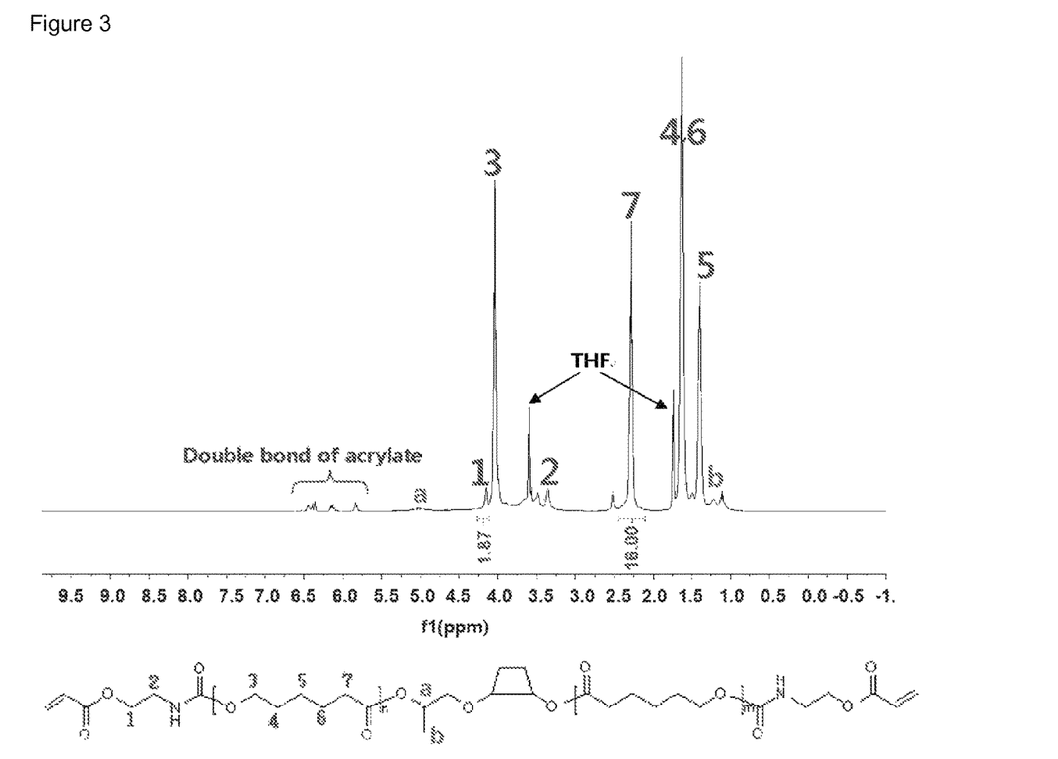
FIG. 3 shows one example of 1H NMR data of polyrotaxane including a macrocycle to which a lactone-based compound including a (meth)acrylate-based compound introduced at the end is bonded.

Further, 1H NMR of polyrotaxane included in the finally obtained polyrotaxane polymer liquid has a shape as shown in FIG. 3 [peak intensity and the like may be different].

The number of caprolactone repeating units in the macrocycle of polyrotaxane (m+n in FIG. 1) was confirmed to be 8.05 through NMR data of FIG. 2, and it can be seen that if the number of repeating units is 8, the $7^{th}$ peak of FIG. 3 has intensity of 16.00 (2H*8).

If the end of the caprolactone repeat unit is 100% substituted by "OH", the $1^{st}$ peak of FIG. 3 relating to acrylate functional groups should be 4.00 (2H*2). Thus, the end substitution rate of a lactone-based compound bonded to the macrocycle of polyrotaxane may be calculated by comparing with practically measured 1H NMR values.

The substitution rate of the finally obtained polyrotaxane polymer liquid (solid content: 15%) was 46.8%.

Example 2

50 g of a caprolactone-grafted polyrotaxane polymer [A1000, Advanced Soft Material Inc.] was introduced into a reactor, and then 9.06 g of Karenz-AOI [2-acryloylethyl isocyanate, Showadenko K.K.], 20 mg of dibutyltin dilaurate [DBTDL, Merck & Co, Inc.], 110 mg of hydroquinone monomethylene ether, and 315 g of methylethylketone were added thereto and reacted at 70° C. for 5 hours, to obtain a polyrotaxane polymer liquid including cyclodextrin to which a polylactone-based compound having an acrylate-based compound introduced at the end is bonded as a macrocycle (solid content: 15%).

The polyrotaxane polymer liquid was dripped into an n-hexane solvent to precipitate a polymer, which was filtered to obtain a white solid polymer (weight average molecular weight: 500,000).

1H NMR data of the polyrotaxane polymer [A1000] that was used as a reactant is as shown in FIG. 1, and the structure of the caprolactone bonded to the macrocycle of polyrotaxane was confirmed through the gCOSY NMR spectrum of FIG. 2.

Further, the 1H NMR of polyrotaxane included in the finally obtained polyrotaxane polymer liquid has a shape as shown in FIG. 3 [peak intensity and the like may be different].

The number of caprolactone repeating units in the macrocycle of polyrotaxane (m+n in FIG. 1) was confirmed to be 8.05 through NMR data of FIG. 2, and it can be seen that if the number of repeating units is 8, the $7^{th}$ peak of FIG. 3 has intensity of 16.00 (2H*8).

If the end of the caprolactone repeating units is 100% substituted by "OH", the $1^{st}$ peak of FIG. 3 relating to acrylate functional groups should be 4.00 (2H*2). Thus, the end substitution rate of a lactone-based compound bonded to the macrocycle of polyrotaxane may be calculated by comparing with practically measured 1H NMR values.

The substitution rate of the finally obtained polyrotaxane polymer liquid (solid content: 15%) was 60.0%.

Comparative Example 1

50 g of caprolactone-grafted polyrotaxane polymer [A1000, Advanced Soft Material Inc.] was introduced into a reactor, and then 13.58 g of Karenz-AOI [2-acryloylethyl isocyanate, Showadenko K.K.], 20 mg of dibutyltin dilaurate [DBTDL, Merck & Co, Inc.], 110 mg of hydroquinone monomethylene ether, and 315 g of methylethylketone were added thereto and reacted at 70° C. for 5 hours, to obtain a polyrotaxane polymer liquid including cyclodextrin to which a polylactone-based compound having an acrylate-based compound introduced at the end is bonded as a macrocycle (solid content: 15%).

It was confirmed by the same method as Examples 1 and 2 that 1H NMR of the polyrotaxane included in the finally obtained polyrotaxane polymer liquid has a shape as shown in FIG. 3 [peak intensity and the like may be different].

As the result of calculating the end substitution rate of the lactone-based compound bonded to the macrocycle of polyrotaxane by the same method as Examples 1 and 2, the substitution rate of the finally obtained polyrotaxane polymer liquid (solid content: 15%) was close to about 100%.

Examples 3 to 4 and Comparative Example 2: Preparation of Photocurable Coating Composition and Coating Film

Example 3

(1) Preparation of Photocurable Coating Composition 100 parts by weight of the polyrotaxane obtained in Example 1, 15 parts by weight of UA-200PA (multifunctional urethane acrylate, Shin-Nakamura Chemical Co., Ltd.), 40 parts by weight of PU-3400 (multifunctional urethane acrylate, Miwon Chemicals Co., Ltd.), 10 parts by weight of Miramer SIU2400 (multifunctional urethane acrylate, Miwon Chemicals Co., Ltd.), 15 parts by weight of Estane-5778 (polyester-based polyurethane, Lubrizol Corporation), 1.5 parts by weight of photoinitiator Irgacure-184, 1.55 parts by weight of photoinitiator Irgacure-907, 12.5 parts by weight of isopropyl alcohol (IPA), and 12.5 parts by weight of ethylcellusolve were mixed to prepared a photocurable coating composition.

(2) Preparation of Coating Film

The photocurable coating composition was coated on a PET film (thickness 188 μm) using a wire bar (No. 70). Further, the coated product was dried at 90° C. for 2 minutes, and UV was irradiated for 5 seconds at 200 mJ/cm² to prepare a film with a thickness of 30 μm.

Example 4: Preparation of Photocurable Coating Composition (1) Preparation of Photocurable Coating Composition A photocurable coating composition was prepared by the same method as Example 3, except using the polyrotaxane obtained in Example 2.

(2) Preparation of Coating Film

The photocurable coating composition was coated on a PET film (thickness 188 μm) using a wire bar (No. 70). And, the coated product was dried at 90° C. for 2 minutes, and then, UV was irradiated for 5 seconds at 200 mJ/cm² to prepare a film with a thickness of 30 μm.

Comparative Example 2

(1) Preparation of Photocurable Coating Composition

A photocurable coating composition was prepared by the same method as Example 3, except using the polyrotaxane obtained in Comparative Example 1.

(2) Preparation of Coating Film

The photocurable coating composition was coated on a PET film (thickness 188 μm) using a wire bar (No. 70). And, the coated product was dried at 90° C. for 2 minutes, and then, UV was irradiated for 5 seconds at 200 mJ/cm² to prepare a film with a thickness of 30 μm.

Experimental Example: Evaluation of Properties of Coating Film

The properties of the coating films obtained in Examples 3 and 4 and Comparative Example 2 were evaluated as follows.

1. Optical properties: Light transmittance and haze were measured using a haze meter (Murakami Co. Ltd HR-10).

2. Self-healing capability: A time to recover from a scratch after rubbing the surface of a coating film with a copper brush at a load of 500 g was measured.

3. Measurement of Scratch Resistance

A constant load was applied to steel wool to cause scratches, and then the surface of a coating film was observed with the naked eye.

4. Mandrel Test

The coating films obtained in the examples and comparative examples were respectively wound 180° around cylindrical mandrels having different thicknesses and maintained for 1 second, and then crack generation was observed with the naked eye, and a time when cracks are not generated was confirmed while lowering a φ value of the cylindrical mandrels.

5. Hardness: Pencil hardness was measured at a load of 500 g.

The measurement results are described in the following Table 1.

TABLE 1

|  | Example 3 | Example 4 | Comparative Example 2 |
|---|---|---|---|
| Transmittance (%)/Haze (%) | 92.3/0.9 | 92.1/0.9 | 99.3/1.0 |
| Self-healing (500 g load) | Within 5 seconds | Within 5 seconds | 45 seconds |
| Steel wool/200 g load | Good (no damage) | Good (no damage) | Good (no damage) |
| Steel wool/300 g load | Good (no damage) | Good (no damage) | Good (no damage) |
| Pencil hardness | F | H | H |
| Mandrel test (Φ) | 4 | 6 | 24 |

As shown in the Table 1, it was confirmed that the coating films prepared in Examples 3 and 4 exhibit low haze while having high transmittance compared to the coating film obtained in Comparative Example 2, thus having an excellent appearance property.

Further, in the experimental example relating to self-healing capability for recovery of the surface within 1 minute after being rubbed with a copper brush, it was also confirmed that the coating films prepared in Examples 3 and 4 have excellent self-healing capability compared to the coating film obtained in Comparative Example 2.

Further, it was confirmed that the coating films prepared in Examples 3 and 4 generate little scratching even under a load of 200 g or 300 g with steel wool, thus having excellent scratch resistance.

It was also confirmed that the coating films prepared in Examples 3 and 4 do not generate cracks even with a cylindrical mandrel having lower Φ value, thus having higher elasticity and durability compared to the comparative example.

What is claimed is:

1. A polyrotaxane compound comprising: a macrocycle to which a lactone-based compound is bonded; a linear molecule penetrating the macrocycle; and blocking groups arranged at both ends of the linear molecule and preventing the macrocycle from escaping,
wherein a final substitution rate at the end of the lactone-based compound bonded to the macrocycle of the polyrotaxane compound is 40 mol % to 70 mol %.

2. The polyrotaxane compound according to claim 1, wherein the final substitution rate at the end of the lactone-based compound bonded to the macrocycle of the polyrotaxane compound is 45 mol % to 65 mol %.

3. The polyrotaxane compound according to claim 1, wherein the macrocycle includes at least one selected from the group consisting of α-cyclodextrin, β-cyclodextrin, and γ-cyclodextrin.

4. The polyrotaxane compound according to claim 1, wherein the lactone-based compound is bonded to the macrocycle by a direct bond or a C1-10 linear or branched oxyalkylene group.

5. The polyrotaxane compound according to claim 1, wherein a residue of the lactone-based compound includes a functional group of the following Chemical Formula 1:

[Chemical Formula 1]

wherein, in Chemical Formula 1, m is an integer of from 2 to 11, and n is an integer of from 1 to 20.

6. The polyrotaxane compound according to claim 1, wherein a (meth)acrylate-based compound is substituted to the end of the lactone-based compound through a direct bond, a urethane bond, an ether bond, a thioester bond, or an ester bond.

7. The polyrotaxane compound according to claim 6, wherein the (meth)acrylate-based compound includes a functional group of the following Chemical Formula 2:

[Chemical Formula 2]

wherein, in Chemical Formula 2, $R_1$ is hydrogen or a methyl, and $R_2$ is a C1-12 linear or branched alkylene group, a C4-20 cycloalkylene group, or a C6-20 arylene group.

8. The polyrotaxane compound according to claim 1, wherein the linear molecule is a polyoxyalkylene-based compound or a polylactone-based compound.

9. The polyrotaxane compound according to claim 1, wherein the linear molecule has a weight average molecular weight of 1000 to 50,000.

10. The polyrotaxane compound according to claim 1, wherein the blocking group includes at least one functional group selected from the group consisting of dinitrophenyl, cyclodextrin, adamantane, trityl, fluorescein, and pyrene groups.

11. The polyrotaxane compound according to claim 1, wherein the polyrotaxane compound has a weight average molecular weight of 100,000 to 800,000.

12. A photocurable coating composition comprising:
the polyrotaxane compound of claim 1;
a polymer resin or a precursor thereof; and
a photoinitiator.

13. The photocurable coating composition according to claim 12, wherein the final substitution rate at the end of the lactone-based compound bonded to the macrocycle of the polyrotaxane compound is 45 mol % to 65 mol %.

14. The photocurable coating composition according to claim 12, wherein the polymer resin is selected from the group consisting of a polysiloxane-based resin, a (meth)acrylate-based resin, and a urethane(meth)acrylate-based resin, a mixture thereof, and a copolymer thereof.

15. The photocurable coating composition according to claim 12, wherein the precursor of the polymer resin includes monomers or oligomers including at least one functional group selected from the group consisting of (meth)acrylate, vinyl, siloxane, epoxy, and urethane groups.

16. The photocurable coating composition according to claim 12, wherein the photoinitiator includes at least one compound selected from the group consisting of an acetophenone-based compound, a biimidazole-based compound, a triazine-based compound, and an oxime-based compound.

17. The photocurable coating composition according to claim 12, comprising: 1 to 95 wt % of the polyrotaxane compound; 1 to 95 wt % of the polymer resin or a precursor thereof; and 0.01 to 10 wt % of the photoinitiator.

18. The photocurable coating composition according to claim 12, further comprising an organic solvent.

19. A coating film comprising a photocured product of the photocurable coating composition of claim 12.

* * * * *